United States Patent
Fu et al.

(10) Patent No.: US 9,070,710 B2
(45) Date of Patent: Jun. 30, 2015

(54) SEMICONDUCTOR PROCESS

(71) Applicant: UNITED MICROELECTRONICS CORP., Hsin-Chu (TW)

(72) Inventors: Ssu-I Fu, Kaohsiung (TW); Cheng-Guo Chen, Changhua County (TW); Yu-Hsiang Hung, Tainan (TW); Chung-Fu Chang, Tainan (TW); Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 19 days.

(21) Appl. No.: 13/912,218

(22) Filed: Jun. 7, 2013

(65) Prior Publication Data

US 2014/0363935 A1    Dec. 11, 2014

(51) Int. Cl.
  *H01L 29/66*    (2006.01)
(52) U.S. Cl.
  CPC ...... *H01L 29/66545* (2013.01); *H01L 29/6656* (2013.01); *H01L 29/66795* (2013.01)
(58) Field of Classification Search
  USPC .................................................. 438/197, 164
  See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,525,160 B2 | 4/2009 | Kavalieros | |
| 7,531,437 B2 | 5/2009 | Brask | |
| 7,569,857 B2 | 8/2009 | Simon, legal representative | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0148217 A1* | 6/2010 | Simonelli et al. ............. 257/192 |
| 2010/0167506 A1 | 7/2010 | Lin | |
| 2011/0147828 A1* | 6/2011 | Murthy et al. ................ 257/327 |
| 2013/0052778 A1 | 2/2013 | Liao | |

\* cited by examiner

*Primary Examiner* — Alexander Ghyka

(74) *Attorney, Agent, or Firm* — Winston Hsu; Scott Margo

(57) ABSTRACT

A semiconductor process includes the following steps. A substrate is provided. At least a fin-shaped structure is formed on the substrate and a gate structure partially overlapping the fin-shaped structure is formed. Subsequently, a dielectric layer is blanketly formed on the substrate, and a part of the dielectric layer is removed to form a first spacer on the fin-shaped structure and a second spacer besides the fin-shaped structure. Furthermore, the second spacer and a part of the fin-shaped structure are removed to form at least a recess at a side of the gate structure, and an epitaxial layer is formed in the recess.

20 Claims, 5 Drawing Sheets

SEMICONDUCTOR PROCESS

BACKGROUND OF THE INVENTION

1. Field of the Invention

The present invention relates generally to a semiconductor process, and more particularly, to a semiconductor process that forms at least a recess in a fin-shaped structure beside a gate structure with light spacer pull down.

2. Description of the Prior Art

With increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices are similar to traditional logic device processes, and thus are more compatible. In addition, since the three-dimensional structure of the FinFET increases the overlapping area between the gate and the fin, the channel region is controlled more effectively. This therefore reduces drain-induced barrier lowering (DIBL) effect and short channel effect. Moreover, the channel region is bigger for the same gate width. Therefore, the current between the source and the drain is increased.

In a current FinFET process, a gate structure (which may include a gate dielectric layer, a gate electrode located on the gate dielectric layer, a cap layer located on the gate electrode, and a spacer located beside the gate dielectric layer, the gate electrode and the cap layer) is formed on a substrate having at least a fin-shaped structure. Then, epitaxial layers are formed on the fin-shaped structure beside the gate structure. The epitaxial layers can be formed in a recess of the fin-shaped structure to enhance the carrier mobility of the gate channel.

However, during the formation of the recess of the fin-shaped structure (the fin recess process), the spacer beside the gate dielectric layer, the gate electrode and the cap layer may be partially removed by the etchant/chemical solvent in the etching/pre-clean steps in the conventional fin recess process, which may induce serious spacer pull down and cause the gate electrode to be exposed. Accordingly, a semiconductor process, more specifically a FinFET process including a fin recess process, which can improve the performances of the epitaxial layers and the reliability of semiconductor device, is needed in the industry.

SUMMARY OF THE INVENTION

It is therefore one of the objectives of the present invention to provide a semiconductor process including a fin recess process, in order to etch and form at least a recess in a fin-shaped structure beside a gate structure without serious spacer pull down.

According to one exemplary embodiment of the present invention, a semiconductor process includes the following steps. A substrate is provided. At least a fin-shaped structure is formed on the substrate and a gate structure partially overlapping the fin-shaped structure is formed. Subsequently, a dielectric layer is blanketly formed on the substrate, and a part of the dielectric layer is removed to form a first spacer on the fin-shaped structure and a second spacer besides the fin-shaped structure. Furthermore, the second spacer and a part of the fin-shaped structure are removed to form at least a recess at a side of the gate structure, and an epitaxial layer is formed in the recess.

The present invention provides a semiconductor process that uses multiple etching processes to form the spacer in order to control an amount of the spacer pull down during the formation of at least a recess in the fin-shaped structure. The etchants used during the etching processes are optimized to have proper etching selectivity between a material of the dielectric and a material of the fin-shaped structure; therefore, the spacer pull down can be well controlled to be substantially smaller than 200 Angstroms (Å). Furthermore, the epitaxial layer formed in the recess more easily induces stresses to the channel below the gate structure, thereby improving the carrier mobility in the channel more effectively.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
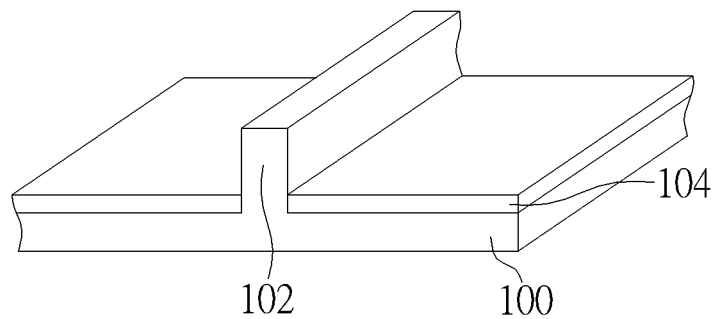
FIG. 1 through FIG. 10 illustrate a semiconductor process according to an exemplary embodiment of the present invention.

Please refer to FIG. 1 through FIG. 10, which illustrate a semiconductor process according to an exemplary embodiment of the present invention. As shown in FIG. 1, a substrate 100 is provided, and the substrate 100 is a bulk substrate such as a silicon substrate, an epitaxial silicon substrate, a silicon germanium substrate, a silicon carbide substrate or a substrate made of semiconductor material, but is not limited thereto. A mask layer (not shown) is formed on the substrate, wherein the mask layer includes a pad oxide layer (not shown) and a nitride layer (not shown) located on the pad oxide layer. A photolithography process is first performed to pattern the mask layer for forming a patterned pad oxide layer (not shown) and a patterned nitride layer (not shown) and exposing a part of the substrate 100. Then, an etching process can be performed on the substrate 100 by using the patterned pad oxide layer and the patterned nitride layer as a hard mask, so that at least a fin-shaped structure 102 can be formed from the part of the substrate 100 that is not etched, in other words, the formed fin-shaped structure 102 is still covered by the patterned pad oxide layer and the patterned nitride layer. In another exemplary embodiment, an epitaxial process is performed to form the desired fin-shaped structures on the exposed part of the substrate 100, and the formed fin-shaped structure may protrude from the patterned pad oxide layer and the patterned nitride layer. Subsequently, the patterned pad oxide layer and the patterned nitride layer are removed. An insulating layer 104 such as an oxide layer is further formed on the substrate 100 except for the substrate 100 where the fin-shaped structure 102 is formed thereon, and the insulating layer 104 may be formed through processes such as a deposition process, a chemical mechanical polishing (CMP) process and an etching back process, to be later used as shallow trench isolation (STI) structure. Accordingly, the fin-shaped structure 102 can be formed on the substrate 100, and the insulating layer 104 can be formed on the substrate 100 except for the substrate 100 where the fin-shaped structure 102 is formed thereon.

Figure 2:
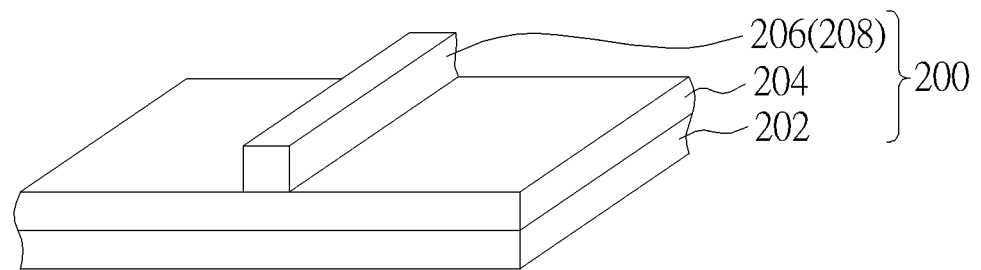

In another exemplary embodiment, as shown in FIG. 2, a substrate 200 as a silicon-on-insulator (SOI) substrate is provided, which includes a silicon substrate 202, a bottom oxide layer 204 located on the silicon substrate 202 and a silicon layer 206 located on the bottom oxide layer 204. The silicon layer 206 is patterned to form a fin-shaped structure 208 and a part of the bottom oxide layer 204 not overlapped by the fin-shaped structures 208 is exposed. The difference between FIG. 1 and FIG. 2 is: the insulating layer 104 formed on the silicon substrate 100 is just located on the substrate 100 except for the region where the fin-shaped structure 102 is formed thereon (as shown in FIG. 1), but the bottom oxide layer 204 formed in the silicon-on-insulator substrate 200 has the fin-shaped structure 208 located thereon. However, the difference does not affect later semiconductor processes of the present invention. The embodiments illustrated above only serve as examples. The fin-shaped structure in the present invention can have a variety of embodiments, which are not described for the sake of simplicity. The following description is based on a single fin-shaped structure 102 of the embodiment shown in FIG. 1, but the semiconductor process of the present invention can also be applied to a substrate having the fin-shaped structure 208 or a plurality of fin-shaped structures.

Figure 3:
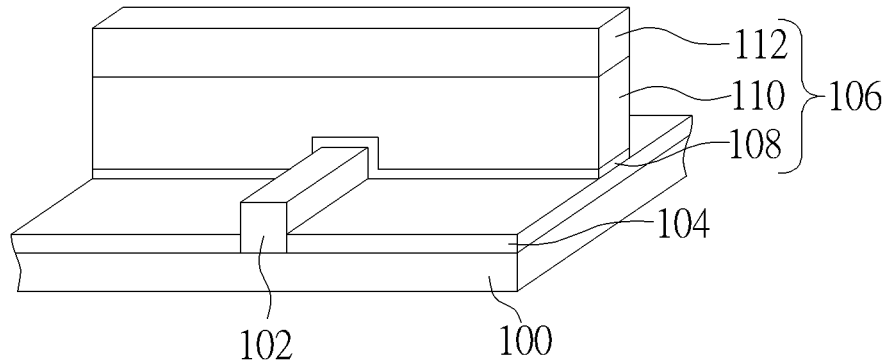

As shown in FIG. 3, a gate structure 106 partially overlapping the fin-shaped structure 102 is formed. The method of forming the gate structure 106 may include the following steps. At first, a gate dielectric material layer (not shown), a gate electrode material layer (not shown) and a cap material layer (not shown) are sequentially formed on the substrate 100. Then, a patterning process is preformed with a patterned photoresist layer (not shown) or a patterned cap material layer as a mask. The gate dielectric material layer, the gate electrode material layer and the cap material layer can therefore be patterned to form the gate structure 106 including a gate dielectric layer 108, a gate electrode 110 and a cap layer 112. The material of the gate dielectric layer 108 may include silicon dioxide ($SiO_2$), silicon nitride (SiN), silicon oxynitride (SiON), high-k dielectric material having a dielectric constant (k value) larger than 4 such as metallic oxide, etc. The metallic oxide used as the material of the gate dielectric layer 108 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The material of the gate electrode 110 may include undoped polysilicon, heavily doped polysilicon, undoped amorphous silicon, heavily amorphous silicon or one or a plurality of metal layer such as a work function metal layer, a barrier layer and a low-resistance metal layer, etc. The cap layer 112 may include a single-layer structure or multi-layer structure made of dielectric materials such as silicon dioxide ($SiO_2$), silicon nitride (SiN), silicon carbide (SiC), silicon carbonitride (SiCN), silicon oxynitride (SiON) or a combination thereof. In this exemplary embodiment, the formed gate structure 106 includes the gate dielectric layer 108 made of silicon oxide, the gate electrode 110 made of doped polysilicon and the cap layer 112 made of silicon nitride and silicon dioxide combination, but not limited thereto. Various metal gate processes may be used in the present invention, including a gate-first process, a high-k first process integrated into the gate-last process, and a high-k last process integrated into the gate-last process. As the gate electrode 110 of the gate structure 106 includes a polysilicon layer, the gate electrode 110 may serve as dummy gate, and a replacement metal gate (RMG) process, such as a gate-last process, can be later performed to replace the polysilicon layer with a metal layer.

Figure 4:
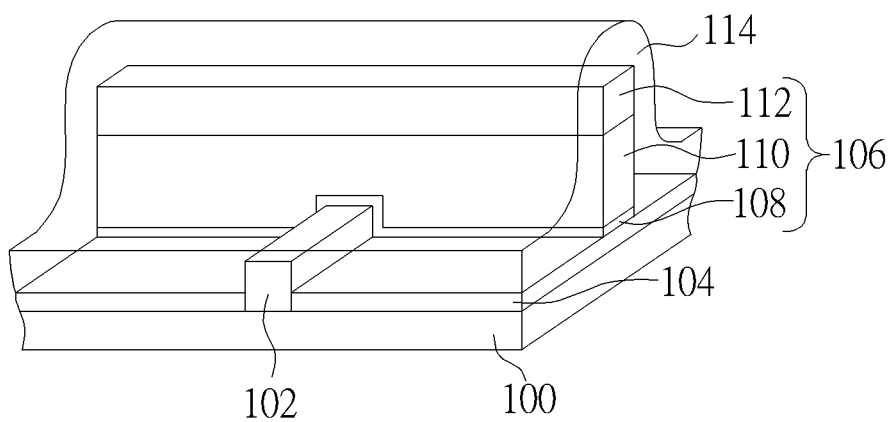

As shown in FIG. 4, a dielectric layer 114 is blanketly formed on the substrate 100 to cover the fin-shaped structure 102, the insulating layer 104 and the gate structure 106, and a first etching process E1 is later performed to remove a part of the dielectric layer 114. The dielectric layer 114 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. In addition, the material of the dielectric layer 114 is preferably different from the material of the cap layer 112; therefore, in this exemplary embodiment, the dielectric layer 114 is made of silicon nitride (SiN), but not limited thereto.

Figure 5:
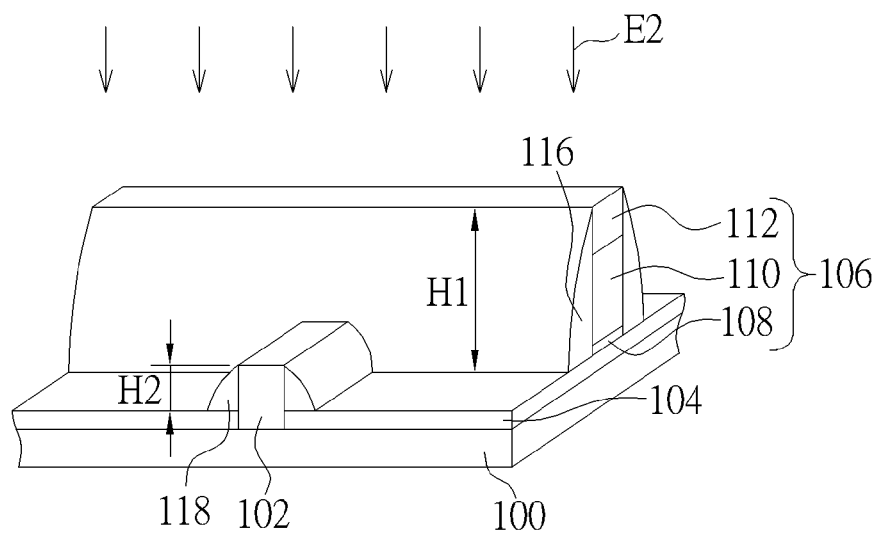

As shown in FIG. 5, and please refer to FIG. 4 together. The first etching process E1 is performed blanketly without etching mask to remove a part of the dielectric layer 114 to form the first spacer 116 and the second spacer 118. The first etching process E1 may be a dry etching process, a wet etching process or a combination thereof. The first spacer 116 aligned with the cap layer 112 of the gate structure 106 partially overlaps the fin-shaped structure 102. More specifically, the formed first spacer 116 surrounds the gate structure 106 and against the sidewalls of the gate structure 106, and overlaps a part of the fin-shaped structure 102 adjacent to the gate structure 106, especially overlaps a part of a top surface of the fin-shaped structure 102, i.e. the first spacer 116 is formed on the fin-shaped structure 102. Furthermore, the second spacer 118 is aligned with the fin-shaped structure 102 and does not cover the fin-shaped structure 102, and especially does not overlap a top surface of the fin-shaped structure 102. More specifically, the formed second spacer 118 surrounds the fin-shaped structure 102 and against the sidewalls of the fin-shaped structure 102, and does not cover the gate structure 106 and the first spacer 116, i.e. the second spacer 118 is formed to be besides the fin-shaped structure 102. A height H1 of the first spacer 116 is substantially higher than a height H2 of the second spacer 118.

It is appreciated that, a first etchant used in the first etching process E1 has etching selectivity between a material of the dielectric layer 114 and a material of the fin-shaped structure 102, and a high removing rate of the material of the dielectric layer 114 to effectively form the spacers. More particularly, the first etchant preferably has a removing rate of the dielectric layer 114, for example made of SiN, higher than a removing rate of the fin-shaped structure 102, for example made of Si. Therefore, the fin-shaped structure 102 may serve as an etching stop layer during the first etching process E1. Additionally, in order to protect the formed gate electrode 110, the first etchant may preferably have the removing rate of the dielectric layer 114, for example made of SiN, higher than a removing rate of the cap layer 112, for example made of $SiO_2$. Therefore, the cap layer 112 may also serve as an etching stop layer in the first etching process E1. In this exemplary embodiment, the first etchant includes fluoro-containing gas such as fluoromethane ($CH_3F$), and the etching selectivity between the material of the dielectric layer 114 and the material of the fin-shaped structure 102, i.e. the ratio of the removing rate of the dielectric layer 114 made of SiN to the removing rate of the fin-shaped structure 102 made of Si, is around 10:1, but not limited thereto.

In another exemplary embodiment, when a part of the gate dielectric layer 108 still remains on the fin-shaped structure 102, the first etchant used in the first etching process E1 may have an etching selectivity between a material of the dielectric layer 114, and a material of the gate dielectric layer 108/the cap layer 112, more specifically, the first etchant may preferably have the removing rate of the dielectric layer 114, for example made of SiN, higher than a removing rate of the gate dielectric layer 108/the cap layer 112, for example made of $SiO_2$. Therefore, the gate dielectric layer 108 and the cap layer 112 may jointly serve as an etching stop layer in the first etching process E1.

Figure 6:
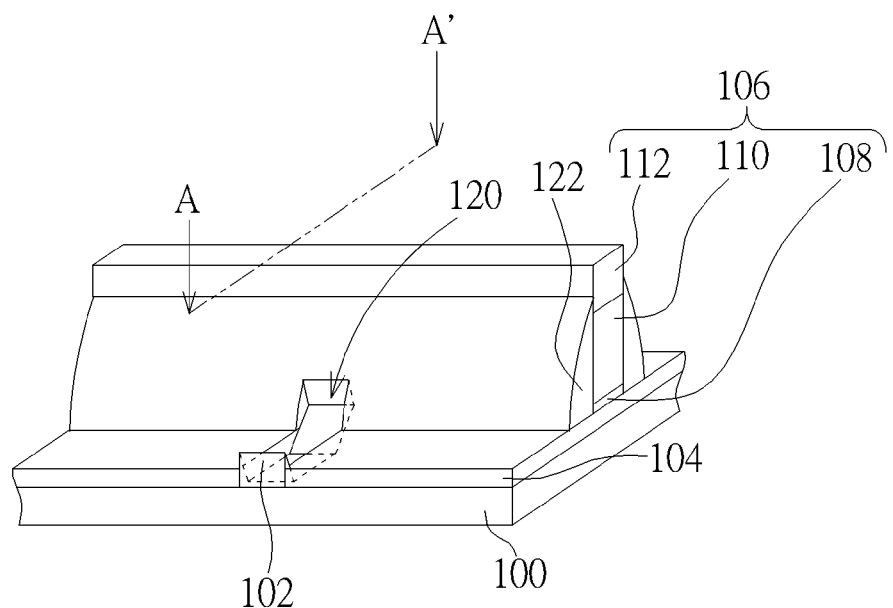
Figure 7:
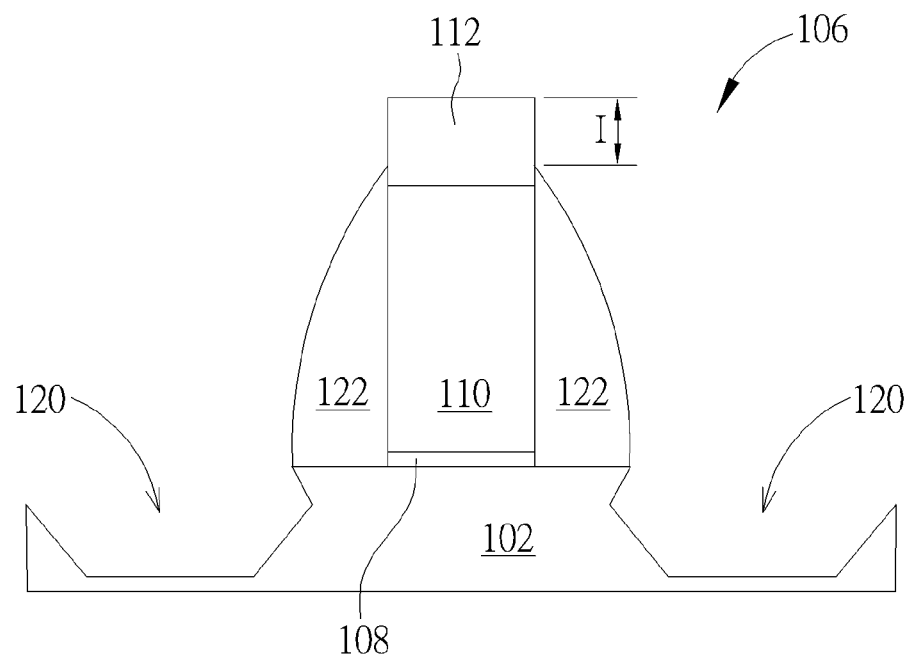

Please refer to FIG. 6 and FIG. 7, and please refer to FIG. 5 together, wherein FIG. 7 is a cross-sectional view taken along the line A-A' of FIG. 6. The second etching process E2 is performed to simultaneously remove the second spacer 118 and a part of the fin-shaped structure 102 to form at least a recess 120 at a side of the gate structure 106. The second etching process E2 may be a dry etching process, a wet etching process or a combination thereof to be performed to form the recesses 120 with various types of shapes, such as a barrel shaped recess, a hexagonal recess or an octagonal recess. Therefore, the epitaxial layer later formed in the recess 120 may have a hexagonal (also called "sigma Σ") or an octagonal cross section, so as to further enhance the induced stress effect on the channel region under the gate structure 106.

It is appreciated that a part of the first spacer 116 may be removed during the formation of the recess 120 as well to form a remaining first spacer 122, and the remaining first spacer 122 can still surround an interface between the cap layer 112 and the gate electrode 110. In other words, the remaining first spacer 122 can still keep the function of the first spacer 116 to prevent the gate electrode 110 from being exposed during the process of forming the recess 120 in the fin-shaped structure 102. In this exemplary embodiment, as the material of the first spacer 116 and the material of the second spacer 118 are the same, a thickness of the cap layer 112 is preferably substantially larger than a thickness of the fin-shaped structure 102 over the insulating layer 104 or the height H2 of the second spacer 118, in order to assure that the remaining first spacer 122 can still surround the cap layer 112, and the interval I between a top of the remaining first spacer 122 and a top of the cap layer 112 is substantially smaller than 200 Angstroms (Å).

In order to ensure the light spacer pull down of the first spacer 116 to render the remaining first spacer 122 completely cover the sidewalls of the gate electrode 110, the interface between the cap layer 112 and the gate electrode 110, and even a part of the cap layer 112, a second etchant used in the second etching process E2 is different form the first etchant used in the first etching process E1.

The second etchant used in the second etching process E2 has an etching selectivity between the material of the dielectric layer 114 (i.e. the material of the first spacer 116 and the material of the second spacer 118) and the material of the fin-shaped structure 102. It is preferred that the removing rate of the material of the dielectric layer 114 by the first etchant is substantially higher than a removing rate of the material of the dielectric layer 114 (i.e. the removing rate of the material of the first spacer 116 and the removing rate of the material of the second spacer 118) by the second etchant to effectively form the pre spacers (the first spacer 116 and the second spacer 118) during the first etching process E1, Moreover, enough spacer could remain to form the final spacer (the remaining first spacer 122) surrounding the gate structure 106 in the second etching process E2. In addition, the ratio of the removing rate of the dielectric layer 114 to the removing rate of the fin-shaped structure 102 by the first etchant is substantially higher than the ratio of the removing rate of the dielectric layer 114 to the removing rate of the fin-shaped structure 102 by the second etchant. That is, compared to the first etchant, the second etchant has a better etching rate of the fin-shaped structure 102; and compared to the second etchant, the first etchant has a better etching rate of the dielectric layer 114. Furthermore, a processing time of the first etching process E1 and a processing time the second etching process E2 could also be modified according to the formed structures on the substrate 100, for example, according to the gate structure 106 (such as the thickness of the cap layer 112) and the fin-shaped structure 102, to form the expected structure of the first spacer 116 and the second spacer 118 through the first etching process E1, and the expected structure of the recess 120 and the remaining first spacer 122 through the second etching process E2. Accordingly, the performance of the second etching process E2 may partially remove the fin-shaped structure 102 to form the recess 120, and partially remove the first spacer 116 to form the remaining first spacer 122, and totally remove the second spacer 118.

In this exemplary embodiment, the second etchant includes halogen-containing gas such as hydrogen bromide (HBr), and the etching selectivity between the material of the dielectric layer 114 (i.e. the material of the first spacer 116 and the material of the second spacer 118) and the material of the fin-shaped structure 102, i.e. the ratio of the removing rate of the dielectric layer 114 (i.e. the first spacer 116 and the second spacer 118) made of SiN to the removing rate of the fin-shaped structure 102 made of Si, is between 1:5 and 1:10, but not limited thereto.

Figure 8:
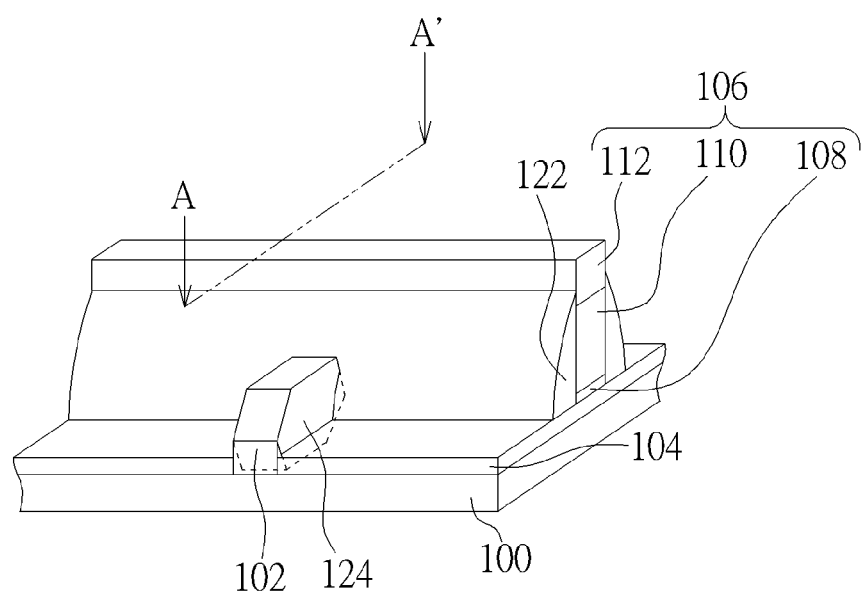
Figure 9:
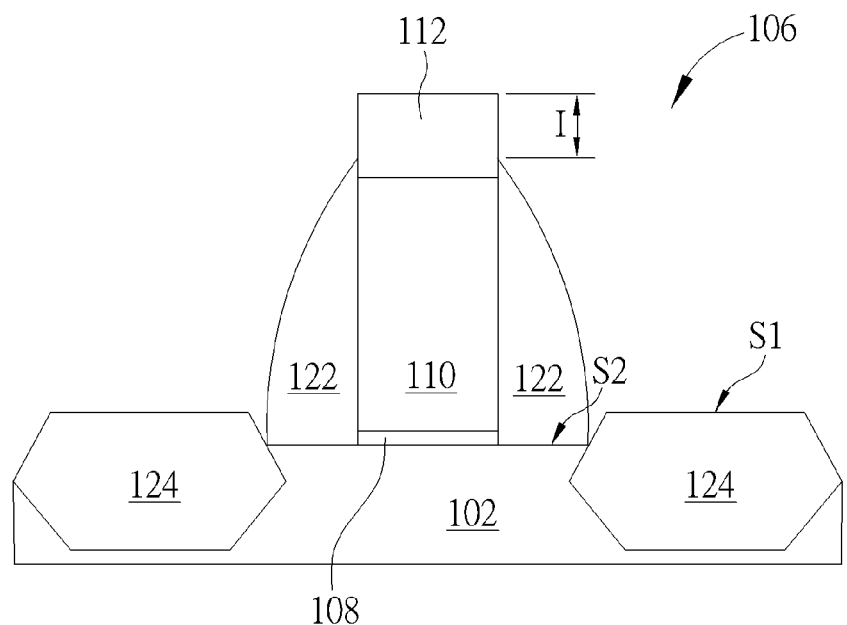

Please refer to FIG. 8 and FIG. 9, wherein FIG. 9 is a cross-sectional view taken along the line B-B' of FIG. 8. An epitaxial process, such as a selective epitaxial growth (SEG) process is performed to form an epitaxial layer 124 in the recess 120. The epitaxial layer 124 may grow conformally along the shape of the recess 120 to have a hexagonal (also called "sigma Σ") or an octagonal cross section corresponding to the shape of the recess 120, in which a bottom surface of epitaxial layer 124 is disposed in the fin-shaped structure 102, to increase the induced stress effect on the channel region under the gate structure 106. In a preferred embodiment, the level of the top surface S1 of the epitaxial layer 124 is higher than the level of the original top surface S2 of the fin-shaped structure 102.

In this exemplary embodiment, when the later formed transistor serves as an NMOS, the epitaxial layer 124 in the recess 120 can be chosen to be a silicon-phosphorous (SiP) epitaxial layer or a silicon-carbon (SiC) epitaxial layer to provide tensile stress to the channel region. Furthermore, when the later formed transistor serves as a PMOS, the epitaxial layer 124 in the recess 120 can be chosen to be a silicon-germanium (SiGe) epitaxial layer to provide compressive stress to the channel region, but is not limited thereto. Afterwards, dopants or impurities may be introduced by implantation or other doping processes. Dopants may be introduced while performing the epitaxial process, so that the epitaxial layer 124 can be used as a source/drain region.

Figure 10:
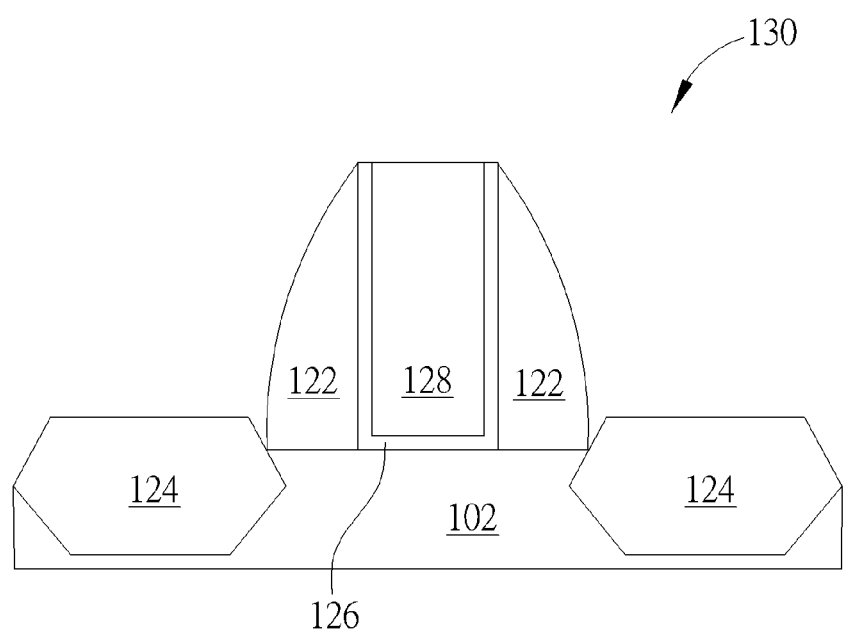

In addition, as shown in FIG. 10, as the gate electrode 110 of the gate structure 106 includes a polysilicon layer, a replacement metal gate (RMG) process, such as a gate-last process, can be performed to replace the polysilicon layer with a metal layer. As the RMG processes are known to those skilled in the art, the details are omitted herein for brevity. Therefore, the formed high-k dielectric layer 126 has a "U-shaped" cross section, and the material of the high-k dielectric layer 126 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The high-k dielectric layer 126 can be formed through an atomic layer deposition (ALD) process or a metal-organic chemical vapor deposition (MOCVD) process, but is not limited thereto. Furthermore, a dielectric layer (not shown) such as a silicon oxide layer can be selectively formed between the substrate 100 and the high-k dielectric layer 126. The metal gate 128 contains one or a plurality of metal layer such as a work function metal layer, a barrier layer and a low-resistance metal layer. A work function metal layer is formed for tuning the work function of the formed gate structure 130 to be appropriate in an NMOS or a PMOS. For an NMOS transistor, the work function metal layer that has a work function ranging between 3.9 eV and 4.3 eV may include titanium aluminide (TiAl), zirconium aluminide (ZrAl), tungsten aluminide (WAl), tantalum aluminide (TaAl), or hafnium aluminide (HfAl), but it is not limited thereto. For a PMOS transistor, the work function metal layer that has a work function ranging between 4.8 eV and 5.2 eV may include titanium nitride (TiN), tantalum nitride (TaN), tantalum carbide (TaC), but it is not limited thereto. The material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Additionally, after forming the metal gate structure through the RMG process, an inter dielectric layer (IDL) can be further formed to cover the gate structure 130, and an etching process is performed to remove a part of the IDL to form contact holes exposing a part of the epitaxial layer 124. Then, a self-aligned metal silicide (salicide) process may be performed to form a metal silicide layer (not shown) on the epitaxial layer 124 which serves as the source/drain regions in order to reduce the electrical resistance between the source/drain regions and the later formed contact plugs. Thereafter, other semiconductor processes such as metal interconnection process may be further performed after the salicide process.

In conclusion, the present invention provides a semiconductor process that uses multi etching processes to form the spacer in order to control an amount of the spacer pull down during the formation of at least a recess in the fin-shaped structure. The etchants used in the etching processes are optimized to have proper etching selectivity between a material of the dielectric and a material of the fin-shaped structure; therefore, the spacer pull down can be well controlled to be substantially smaller than 200 Angstroms (Å). Furthermore, the epitaxial layer formed in the recess can induce stresses more easily to the gate channel below the gate structure, thereby improving the carrier mobility in the gate channel more effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
providing a substrate;
forming at least a fin-shaped structure in the substrate;
forming a gate structure partially overlapping the fin-shaped structure;
blanketly forming a dielectric layer on the substrate;
removing a part of the dielectric layer to form a first spacer on the fin-shaped structure and a second spacer besides the fin-shaped structure;
simultaneously removing the second spacer and a part of the fin-shaped structure to form at least a recess at a side of the gate structure, wherein a part of the first spacer is removed during the formation of the recess to form a remaining first spacer; and
forming an epitaxial layer in the recess.

2. The semiconductor process according to claim 1, wherein the first spacer partially overlaps the fin-shaped structure.

3. The semiconductor process according to claim 1, wherein the first spacer surrounds the gate structure and overlaps a part of the fin-shaped structure adjacent to the gate structure.

4. The semiconductor process according to claim 1, wherein the second spacer is aligned with the fin-shaped structure before forming the recess.

5. The semiconductor process according to claim 1, wherein the second spacer surrounds the fin-shaped structure and does not cover the gate structure and the first spacer.

6. The semiconductor process according to claim 1, wherein the gate structure comprises a gate dielectric layer, a gate electrode and a cap layer.

7. The semiconductor process according to claim 6, wherein a part of the first spacer is removed during the formation of the recess to form a remaining first spacer, and the remaining first spacer surrounds an interface between the cap layer and the gate electrode.

8. The semiconductor process according to claim 7, wherein after forming the recess, an interval between a top of the remaining first spacer and a top of the cap layer is substantially smaller than 200 Angstroms (Å).

9. The semiconductor process according to claim 6, wherein the gate electrode comprises a polysilicon layer.

10. The semiconductor process according to claim 9, further comprising performing a replacement metal gate (RMG) process to replace the polysilicon layer with a metal layer.

11. The semiconductor process according to claim 1, wherein a first etching process is performed to remove a part of the dielectric layer to form the first spacer and the second spacer, and a second etching process is performed to remove the second spacer and a part of the fin-shaped structure to form the recess.

12. The semiconductor process according to claim 11, wherein a first etchant used in the first etching process is different form a second etchant used in the second etching process.

13. The semiconductor process according to claim 12, wherein the first etchant comprises fluoromethane ($CH_3F$), and the second etchant comprises hydrogen bromide (HBr).

14. The semiconductor process according to claim 12, wherein a removing rate of a material of the dielectric layer by the first etchant is substantially higher than a removing rate of a material of the dielectric layer by the second etchant.

15. The semiconductor process according to claim 12, wherein a ratio of a removing rate of the dielectric layer to a removing rate of the fin-shaped structure by the first etchant is substantially higher than a ratio of a removing rate of the dielectric layer to a removing rate of the fin-shaped structure by the second etchant.

16. The semiconductor process according to claim 15, wherein a material of the dielectric layer comprises silicon nitride, and a material of the fin-shaped structure comprises silicon.

17. The semiconductor process according to claim 16, wherein the first etchant has a ratio of the removing rate of the dielectric layer to the removing rate of the fin-shaped structure around 10:1.

18. The semiconductor process according to claim 16, wherein the second etchant has a ratio of the removing rate of the dielectric layer to the removing rate of the fin-shaped structure between 1:5 and 1:10.

19. The semiconductor process according to claim 1, wherein the substrate comprises a silicon-on-insulator (SOI) substrate or a bulk silicon substrate.

20. The semiconductor process according to claim 1, wherein the epitaxial layer comprises silicon-germanium (SiGe) epitaxial layer, silicon-carbon (SiC) epitaxial layer or silicon-phosphorous (SiP) epitaxial layer.

* * * * *